United States Patent
Rhyu et al.

(10) Patent No.: US 10,433,024 B2
(45) Date of Patent: Oct. 1, 2019

(54) METHOD AND APPARATUS FOR CONFIGURING CONTENT IN A BROADCAST SYSTEM

(75) Inventors: Sung-Ryeul Rhyu, Gyeonggi-do (KR); Jae-Yeon Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/421,375

(22) Filed: Mar. 15, 2012

(65) Prior Publication Data

US 2012/0240174 A1    Sep. 20, 2012

(30) Foreign Application Priority Data

Mar. 16, 2011    (KR) .................. 10-2011-0023578

(51) Int. Cl.
| | |
|---|---|
| *H04N 7/16* | (2011.01) |
| *H04N 21/643* | (2011.01) |
| *H04N 21/236* | (2011.01) |
| *H04L 29/06* | (2006.01) |
| *H04N 21/2381* | (2011.01) |
| *H03M 13/35* | (2006.01) |

(52) U.S. Cl.
CPC ....... *H04N 21/643* (2013.01); *H04L 65/4076* (2013.01); *H04L 65/607* (2013.01); *H04L 65/608* (2013.01); *H04N 21/2381* (2013.01); *H04N 21/23605* (2013.01); *H04N 21/23608* (2013.01); *H03M 13/35* (2013.01)

(58) Field of Classification Search
CPC ........... H04N 21/643; H04N 21/23605; H04N 21/23608; H04N 21/2381; H04L 65/4076; H04L 65/607; H04L 65/608; H03M 13/35

USPC ..... 370/240.27, 312, 252; 714/792; 375/240
See application file for complete search history.

(56) References Cited

U.S. PATENT DOCUMENTS

| | | | | |
|---|---|---|---|---|
| 5,809,201 A * | 9/1998 | Nagasawa | .............. | H04N 19/61 386/314 |
| 5,926,610 A * | 7/1999 | Sugiyama | ............ | H04N 5/9262 386/266 |
| 6,064,794 A * | 5/2000 | McLaren | ................. | H04N 5/91 386/343 |

(Continued)

FOREIGN PATENT DOCUMENTS

| | | | |
|---|---|---|---|
| EP | 1555827 A2 * | 7/2005 | |
| EP | 1670254 A1 * | 6/2006 | |

(Continued)

OTHER PUBLICATIONS

David Gozalvez et al., "AL-FEC for Improved Mobile Reception of MPEG-2 DVB-T Transport Streams", International Journal of Digital Multimedia Broadcasting, Jan. 1, 2009.

(Continued)

*Primary Examiner* — An Son P Huynh
(74) *Attorney, Agent, or Firm* — The Farrell Law Firm, P.C.

(57) ABSTRACT

A method and an apparatus are provided for configuring content in a broadcast system. The method includes encapsulating a plurality of Access Units (AUs) transmitted from a higher layer to generate a Data Unit (DU); rearranging the AUs within the DU; and inserting a header into the DU to transfer the DU to a lower layer. The header includes DU description information and AU structure description information indicating a structure of the plurality of AUs.

8 Claims, 11 Drawing Sheets

(56) References Cited

U.S. PATENT DOCUMENTS

| | | | | |
|---|---|---|---|---|
| 6,138,147 A * | 10/2000 | Weaver | G11B 27/031 | 348/E5.008 |
| 6,434,319 B1 * | 8/2002 | Wine | H04N 5/783 | 386/230 |
| 6,671,323 B1 * | 12/2003 | Tahara | G11B 27/031 | 375/240.12 |
| 6,871,006 B1 * | 3/2005 | Oguz | G11B 27/031 | 348/E7.073 |
| 7,096,487 B1 * | 8/2006 | Gordon | H04N 5/4401 | 348/E5.108 |
| 7,409,702 B2 * | 8/2008 | Cao | H04N 21/235 | 370/486 |
| 7,440,674 B2 * | 10/2008 | Plotnick | G11B 27/005 | 348/E5.099 |
| 8,310,947 B2 * | 11/2012 | Hwang | | 370/252 |
| 8,792,780 B2 * | 7/2014 | Hattori | G11B 27/034 | 386/353 |
| 8,806,050 B2 * | 8/2014 | Chen | H04L 65/604 | 709/227 |
| 8,973,028 B2 * | 3/2015 | Ahn | H04H 20/10 | 705/14.4 |
| 9,185,335 B2 * | 11/2015 | Tariolle | H04N 5/775 | |
| 9,223,643 B2 * | 12/2015 | Cooper | G06F 11/07 | |
| 9,432,433 B2 * | 8/2016 | Luby | H04N 21/23106 | |
| 2001/0017978 A1 * | 8/2001 | Nagasawa | G11B 20/10 | 386/329 |
| 2001/0043792 A1 * | 11/2001 | Mishima | H04N 5/85 | 386/329 |
| 2001/0055471 A1 * | 12/2001 | Nakatani | G11B 27/105 | 386/326 |
| 2002/0001314 A1 | 1/2002 | Yi et al. | | |
| 2002/0003811 A1 * | 1/2002 | Herrmann | | 370/474 |
| 2002/0083125 A1 * | 6/2002 | Herrmann | H04L 41/5019 | 709/203 |
| 2002/0176025 A1 * | 11/2002 | Kim | H03M 7/30 | 348/699 |
| 2003/0016755 A1 * | 1/2003 | Tahara | H04N 19/10 | 375/240.25 |
| 2003/0043923 A1 * | 3/2003 | Zhang | H04N 21/234309 | 375/240.27 |
| 2003/0046429 A1 * | 3/2003 | Sonksen | G06F 15/17337 | 709/246 |
| 2003/0138043 A1 * | 7/2003 | Hannuksela | H04N 19/46 | 375/240.08 |
| 2003/0185299 A1 * | 10/2003 | Takita | H04N 19/159 | 375/240.03 |
| 2004/0036800 A1 * | 2/2004 | Ohki | H04N 19/30 | 348/459 |
| 2004/0066846 A1 * | 4/2004 | Yun | H04N 13/0048 | 375/240.08 |
| 2004/0202320 A1 * | 10/2004 | Amini | H04L 29/06027 | 380/36 |
| 2005/0041745 A1 * | 2/2005 | Zhang | H04N 19/89 | 375/240.27 |
| 2005/0169303 A1 * | 8/2005 | Toma | H04N 7/52 | 370/466 |
| 2005/0175098 A1 * | 8/2005 | Narasimhan et al. | H04N 21/2368 | 375/240.12 |
| 2005/0213666 A1 * | 9/2005 | Kaneko | G11B 27/105 | 375/240.26 |
| 2005/0219382 A1 * | 10/2005 | Abe | H04N 5/772 | 348/231.99 |
| 2006/0120464 A1 * | 6/2006 | Hannuksela | H04N 19/105 | 375/240.27 |
| 2006/0136440 A1 * | 6/2006 | Cotarmanac'h | H04N 7/17318 | |
| 2006/0143666 A1 * | 6/2006 | Okada | G11B 20/10 | 725/89 |
| 2006/0168133 A1 | 7/2006 | Park et al. | | |
| 2006/0171458 A1 | 8/2006 | Feng et al. | | |
| 2006/0227872 A1 * | 10/2006 | Mori | H04N 21/434 | 375/240.12 |
| 2006/0233525 A1 * | 10/2006 | Shibata | H04N 19/70 | 386/329 |
| 2007/0043875 A1 * | 2/2007 | Brannon, Jr. | H04N 21/23608 | 709/231 |
| 2007/0116426 A1 * | 5/2007 | Toma | G11B 27/005 | 386/248 |
| 2007/0171976 A1 * | 7/2007 | Toma | H04N 21/23614 | 375/240.15 |
| 2007/0174870 A1 * | 7/2007 | Nagashima | H04H 60/31 | 725/40 |
| 2007/0250639 A1 | 10/2007 | Roullet et al. | | |
| 2007/0268971 A1 * | 11/2007 | Kato | G11B 20/10 | 375/240.26 |
| 2007/0274679 A1 * | 11/2007 | Yahata | G11B 20/1217 | 386/241 |
| 2007/0286244 A1 * | 12/2007 | Koyabu | G11B 27/005 | 370/498 |
| 2008/0008447 A1 * | 1/2008 | Iwase | G10L 19/167 | 386/326 |
| 2008/0049789 A1 * | 2/2008 | Vedantham | H04N 21/235 | 370/474 |
| 2008/0117988 A1 * | 5/2008 | Toma | G11B 27/005 | 375/240.26 |
| 2008/0141091 A1 * | 6/2008 | Kalluri | H04N 21/43615 | 714/748 |
| 2008/0181228 A1 * | 7/2008 | Hannuksela | H04N 21/234327 | 370/394 |
| 2008/0232467 A1 * | 9/2008 | Iguchi | H04N 5/85 | 375/240.12 |
| 2008/0250037 A1 * | 10/2008 | Date | G06F 17/30038 | |
| 2008/0273698 A1 * | 11/2008 | Manders | H04N 5/783 | 380/200 |
| 2009/0106807 A1 * | 4/2009 | Suzuki | H04N 21/23424 | 725/114 |
| 2009/0129689 A1 * | 5/2009 | Boyce | H04N 19/40 | 382/236 |
| 2009/0142041 A1 * | 6/2009 | Nagasawa | H04N 13/0033 | 386/341 |
| 2009/0168891 A1 * | 7/2009 | Cheong | H04N 19/46 | 375/240.23 |
| 2009/0177949 A1 | 7/2009 | Lamy-Bergot et al. | | |
| 2009/0252473 A1 * | 10/2009 | Kobayashi | H04N 9/8205 | 386/248 |
| 2009/0282444 A1 * | 11/2009 | Laksono | H04N 7/17336 | 725/89 |
| 2009/0285309 A1 * | 11/2009 | Wiegand | H04L 29/06027 | 375/240.25 |
| 2009/0296624 A1 * | 12/2009 | Ryu | H04H 20/72 | 370/312 |
| 2010/0003006 A1 * | 1/2010 | Tokunaka | G11B 27/034 | 386/290 |
| 2010/0005184 A1 * | 1/2010 | Babonneau | H04L 47/10 | 709/231 |
| 2010/0008419 A1 * | 1/2010 | Wu | H04N 19/105 | 375/240.15 |
| 2010/0046609 A1 * | 2/2010 | Toma | H04N 5/7605 | 375/240.01 |
| 2010/0049865 A1 * | 2/2010 | Hannuksela | H04N 21/234327 | 709/231 |
| 2010/0091841 A1 * | 4/2010 | Ishtiaq | H04N 19/147 | 375/240.02 |
| 2010/0100791 A1 | 4/2010 | Abu-Surra et al. | | |
| 2010/0129052 A1 * | 5/2010 | Fujinami | G11B 27/005 | 386/241 |
| 2010/0189182 A1 * | 7/2010 | Hannuksela | H04N 21/234327 | 375/240.25 |
| 2010/0223533 A1 * | 9/2010 | Stockhammer | H03M 13/373 | 714/776 |
| 2010/0254453 A1 * | 10/2010 | Dane | H04N 7/0112 | 375/240.12 |
| 2010/0316139 A1 * | 12/2010 | Le Leannec | H04N 19/159 | 375/240.29 |
| 2010/0329192 A1 * | 12/2010 | Hwang | | 370/329 |
| 2011/0019693 A1 * | 1/2011 | Fu | H04L 69/32 | 370/469 |

(56) References Cited

U.S. PATENT DOCUMENTS

| | | | | |
|---|---|---|---|---|
| 2011/0066923 | A1* | 3/2011 | Koshiyama | G06F 11/1068 714/773 |
| 2011/0087952 | A1* | 4/2011 | Marin | H04L 1/0072 714/792 |
| 2011/0208829 | A1* | 8/2011 | Kwon | H04N 21/234327 709/217 |
| 2011/0238789 | A1* | 9/2011 | Luby | H04N 21/23106 709/219 |
| 2011/0255558 | A1* | 10/2011 | Hwang | H04L 65/60 370/474 |
| 2011/0293021 | A1* | 12/2011 | Kotalwar | H04N 21/233 375/240.26 |
| 2011/0317771 | A1* | 12/2011 | Chen | G11B 27/007 375/240.25 |
| 2012/0016965 | A1* | 1/2012 | Chen | H04N 21/23439 709/219 |
| 2012/0099643 | A1* | 4/2012 | Karegoudar | H04N 19/46 375/240.06 |
| 2012/0278498 | A1* | 11/2012 | Zink | H04N 21/235 709/231 |
| 2013/0145394 | A1* | 6/2013 | Bakke | H04N 21/472 725/38 |
| 2013/0315573 | A1* | 11/2013 | Sasaki | H04N 19/597 386/356 |

FOREIGN PATENT DOCUMENTS

| | | |
|---|---|---|
| EP | 1 725 036 | 11/2006 |
| EP | 2 071 850 | 6/2009 |

OTHER PUBLICATIONS

Ali Talari et al., "Unequal Error Protection Rateless Coding for Efficient MPEG Video Transmission", Military Communications Conference, Oct. 18, 2009.
Anonymous: "The TCP/IP Guide—IP Datagram Encapsulation", XP055393874, Internet, Sep. 20, 2005, 3 pages.
European Search Report dated Aug. 2, 2017 issued in counterpart application No. 12757912.6-1901, 7 pages.
Anonymous: "Presentation and Access Units", XP055511410, Wikipedia, Feb. 1, 2011, 4 pages.
EP Summons to Attend Oral Proceedings dated Nov. 2, 2018 issued in counterpart application No. 12757912.6-1207, 9 pages.

* cited by examiner

METHOD AND APPARATUS FOR CONFIGURING CONTENT IN A BROADCAST SYSTEM

PRIORITY

This application claims priority under 35 U.S.C. §119(a) to Korean Patent Application Serial No. 10-2011-0023578, which was filed in the Korean Industrial Property Office on Mar. 16, 2011, the entire content of which is incorporated herein by reference.

BACKGROUND OF THE INVENTION

1. Field of the Invention

The present invention relates generally to a method and an apparatus for configuring content in a broadcast system, and more particularly, to a method and an apparatus for configuring a data unit of content in a broadcast system supporting multimedia services based on an Internet Protocol (IP).

2. Description of the Related Art

A conventional broadcast network generally uses the Moving Picture Experts Group-2 Transport Stream (MPEG-2 TS) for transmission of multimedia content. The MPEG-2 TS is a representative transmission technique that allows a plurality of broadcast programs (a plurality of encoded video bit streams) to transmit multiplexed bit streams in a transmission environment having errors. For example, the MPEG-2 TS is appropriately used in digital TeleVsion (TV) broadcasting, etc.

FIG. 1 illustrates a layer structure supporting a conventional MPEG-2 TS.

Referring to FIG. 1, the conventional MPEG-2 TS layer includes a media coding layer 110, a sync (synchronization) layer 120, a delivery layer 130, a network layer 140, a data link layer 150, and a physical layer 160. The media coding layer 110 and the sync layer 120 configure media data to a format usable for recording or transmission. The delivery layer 130, the network layer 140, the data link layer 150, and the physical layer 160 configure a multimedia frame for recording or transmitting a data block having the format configured by the sync layer 120 in/to a separate recording medium. The configured multimedia frame is transmitted to a subscriber terminal, etc., through a predetermined network.

Accordingly, the sync layer 120 includes a fragment block 122 and an access unit 124, and the delivery layer 130 includes an MPEG-2 TS/MPEG-4 (MP4) Real-time Transport Protocol (RTP) Payload Format/File delivery over unidirectional transport (FLUTE) 132 block, an RTP/HyperText Transfer Protocol (HTTP) block 134, and a User Datagram Protocol (UDP)/Transmission Control Protocol (TCP) block 136.

However, the MPEG-2 TS has several limitations in supporting multimedia services. Specifically, the MPEG-2 TS has limitations of inefficient transmission due to unidirectional communication and a fixed size of a frame, generation of an unnecessary overhead due to the usage of a transport protocol, and an IP specialized for audio/video data, etc.

Accordingly, the newly proposed MPEG MEDIA Transport (MMT) standard has been proposed by MPEG in order to overcome the above-described limitations of the MPEG-2 TS.

For example, the MMT standard may be applied for the efficient transmission of complex content through heterogeneous networks. Here, the complex content includes a set of content having multimedia factors by a video/audio application, etc. The heterogeneous networks include networks in which a broadcast network and a communication network coexist.

In addition, the MMT standard attempts to define a transmission technique that is friendlier to an IP that is a basic technique in a transmission network for the multimedia services.

Accordingly, the MMT standard attempts to representatively provide efficient MPEG transmission techniques in a multimedia service environment that changes based on the IP, and in this respect, the standardization and continuous research of the MMT standard have been progressed.

FIG. 2 illustrates a conventional layer structure of an MMT system for transmission of a multimedia frame according to multi-service/content through heterogeneous networks.

Referring to FIG. 2, an MMT system for configuring and transmitting a multimedia frame includes a media coding layer 210, an encapsulation layer (Layer E) 220, delivery layers (Layer D) 230 and 290, a network layer 240, a data link layer 250, a physical layer 260, and control layers (Layer C) 270 and 280. The layers include three technique areas, Layer E 220, Layers D 230 and 290, and Layers C 270 and 280. Layer E 220 controls complex content generation, Layers D 230 and 290 control the transmission of the generated complex content through the heterogeneous network, and Layers C 270 and 280 control consumption management and the transmission management of the complex content.

Layer E 220 includes three layers, i.e., MMT E.3 222, MMT E.2 224, and MMT E.1 226. The MMT E.3 222 generates a fragment, which is a basic unit for the MMT service, based on coded multimedia data provided from the media coding layer 210. The MMT E.2 224 generates an Access Unit (AU) for the MMT service by using the fragment generated by the MMT E.3 222. The AU is the smallest data unit having a unique presentation time. The MMT E.1 226 combines or divides the AUs provided by the MMT E.2 224 to generate a format for generation, storage, and transmission of the complex content.

Layer D includes three layers, i.e., MMT D.1 232, MMT D.2 234, and MMT D.3 290. The MMT D.1 232 operates with an Application Protocol (AP) similarly functioning to the RTP or the HTTP, the MMT D.2 234 operates with a network layer protocol similarly functioning to the UDP or the TCP, and the MMT D.3 290 controls optimization between the layers included in Layer E 220 and the layers included in Layer D 230.

Layer C includes two layers, i.e., MMT C.1 270 and MMT C.2 280. The MMT C.1 270 provides information related to the generation and the consumption of the complex content, and the MMT C.2 280 provides information related to the transmission of the complex content.

FIG. 3 illustrates a conventional data transmission layer for a broadcast system.

Referring to FIG. 3, Layer E in a transmission side stores elements of the content, such as video and audio, encoded to a Network Abstraction Layer (NAL) unit, a fragment unit, etc., by a codec encoder, such as an Advanced Video Codec (AVC) and a Scalable Video Codec (SVC) in units of AUs in layer E3, which is the top-level layer, and transmits the stored elements in the units of AUs to layer E2, which is a lower layer.

In the conventional technique, a definition and a construction of the AU transmitted from Layer E3 to Layer E2 depend on a codec.

Layer E2 structuralizes a plurality of AUs, encapsulates the structuralized AUs based on Layer E2 units, stores the encapsulated AUs in the unit of Elementary Streams (ES), and transmits the stored AUs to Layer E1, which is a next lower layer. Layer E1 instructs a relation and a construction of the elements of the content, such as the video and audio, encapsulates the elements together with the ES, and transmits the encapsulated elements to Layer D1 in units of packages.

Layer D1 divides a received package in accordance with a form suitable for transmission of the divided package to a lower layer, and the lower layer then transmits the packet to a next lower layer.

Layer D in a reception side collects the packets transmitted from the transmission side to configure the collected packets to the package of Layer E1. A receiver recognizes elements of the content within the package, a relation between the elements of the content, and information on construction of the elements of the content, to transfer the recognized information to a content element relation/construction processor and a content element processor. The content relation/construction processor transfers the respective elements for the proper reproduction of the entire content to the content element processor, and the content element processor controls elements to be reproduced at a set time and displayed at a set position on a screen.

However, a conventional Layer E2 technique provides only the AU itself or information on a processing time for the AU reproduction, e.g., a Decoding Time Stamp (DTS) or a Composition Time Stamp (CTS) and a Random Access Point (RAP). Accordingly, the utilization of the conventional Layer E2 technique is limited.

SUMMARY OF THE INVENTION

Accordingly, the present invention is designed to address at least the above-described problems and/or disadvantages occurring in the prior art, and to provide at least the advantages described below.

An aspect of the present invention is to provide a method of configuring AUs to a data unit for efficient reproduction of the AUs in Layer E2.

In accordance with an aspect of the present invention, a method is provided for configuring content in a broadcast system supporting a multimedia service based on an IP. The method includes encapsulating a plurality of Access Units (AUs) transmitted from a higher layer to generate a Data Unit (DU); rearranging the AUs within the DU; and inserting a header into the DU to transfer the DU to a lower layer. The header includes DU description information and AU structure description information indicating a structure of the plurality of AUs.

In accordance with another aspect of the present invention, an apparatus is provided for configuring content in a broadcast system supporting a multimedia service based on an IP. The apparatus includes a content generator for encapsulating a plurality of Access Units (AUs) transmitted from a higher layer to generate a Data Unit (DU), rearranging the AUs within the DU, and inserting a header into the DU to transfer the DU to a lower layer.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION OF EMBODIMENTS OF THE INVENTION

Hereinafter, various embodiments of the present invention will be described with reference to the accompanying drawings in detail. In the following description, a detailed explanation of known related functions and constitutions may be omitted to avoid unnecessarily obscuring the subject matter of the present invention. Further, the terms used in the description are defined considering the functions of the present invention and may vary depending on the intention or usual practice of a user or operator. Therefore, the definitions should be made based on the entire content of the description.

In accordance with an embodiment of the present invention, a method is proposed for configuring DUs by grouping a plurality of AUs. The DUs are continuously concatenated to become Elementary Streams (ES), which become data transmitted from Layer E2 to Layer E1.

Conventionally, a DU is configured by encapsulating the AUs one by one, a DTS and a CTS are granted to each AU, and a picture type (Intra (I)-picture, Bidirectionally Predictive (B)-picture, or Predictive (P)-picture) of a corresponding AU is expressed in each AU or whether a corresponding AU is a RAP is displayed.

Figure 1:
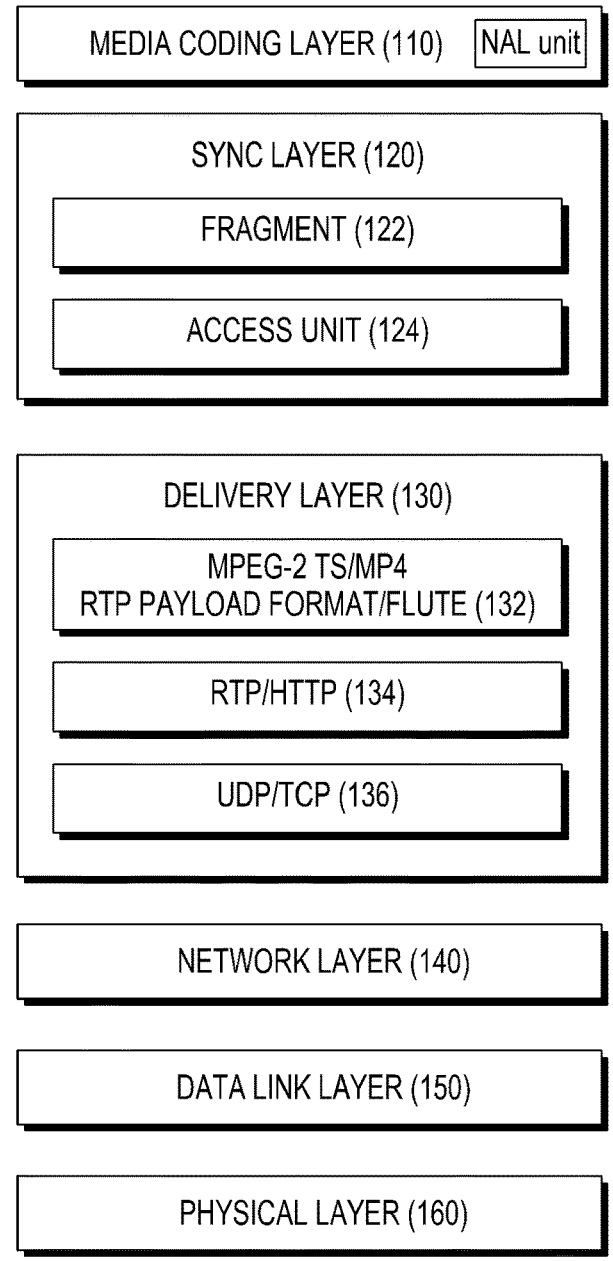
FIG. 1 is a block diagram illustrating a layer structure for a conventional MPEG-2 TS.
Figure 2:
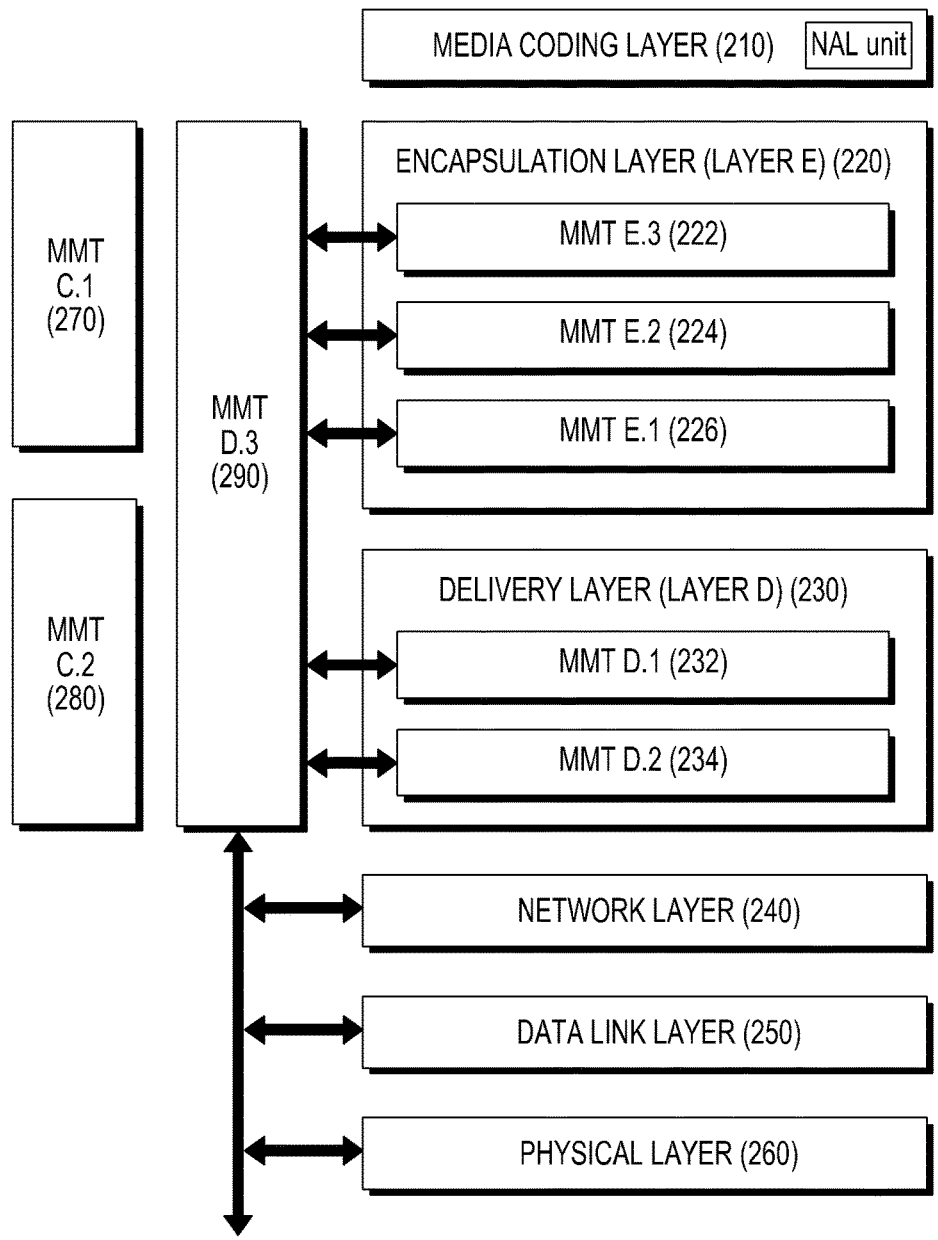
FIG. 2 is a block diagram illustrating an MMT service by a broadcast system based on a conventional MMT standard.
Figure 3:
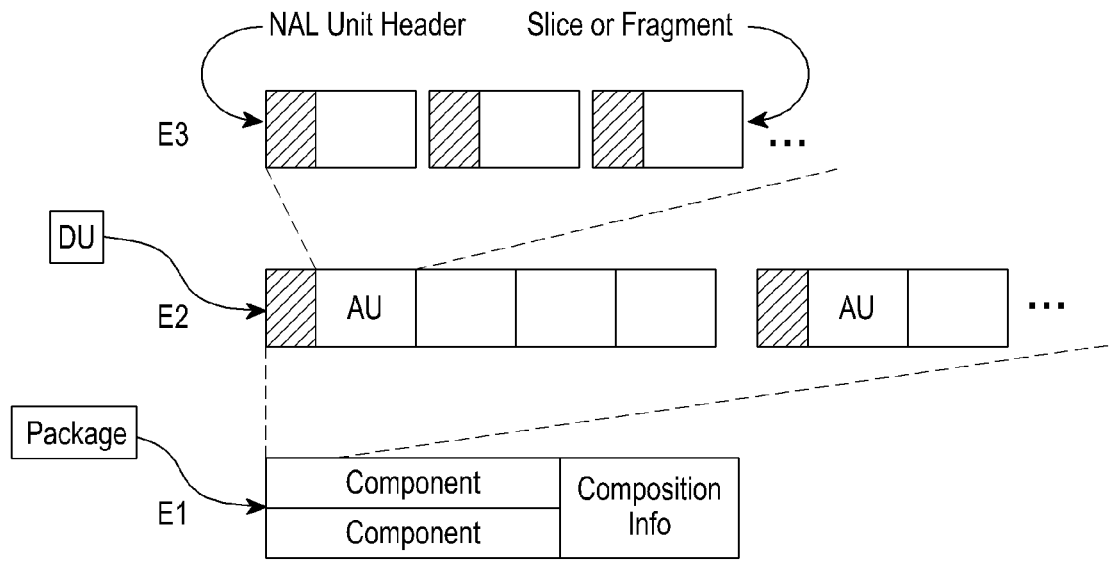
FIG. 3 illustrates a conventional data transmission layer diagram in a broadcast system.
Figure 4:
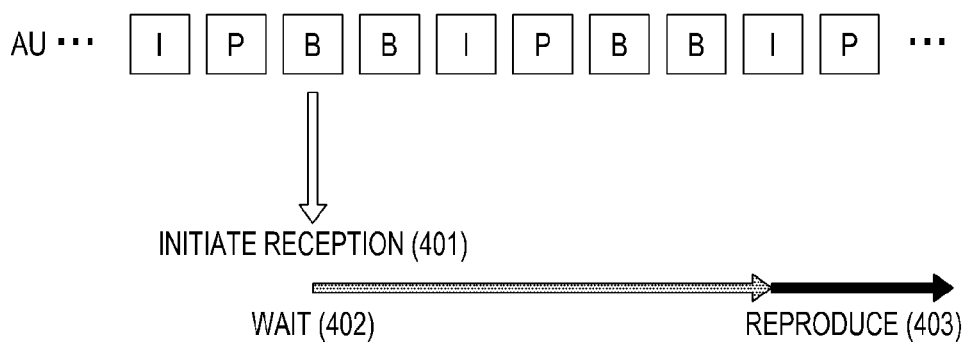
FIG. 4 illustrates a conventional reproduction flow of a DU configured through encapsulation of AUs one by one.
Figure 5:
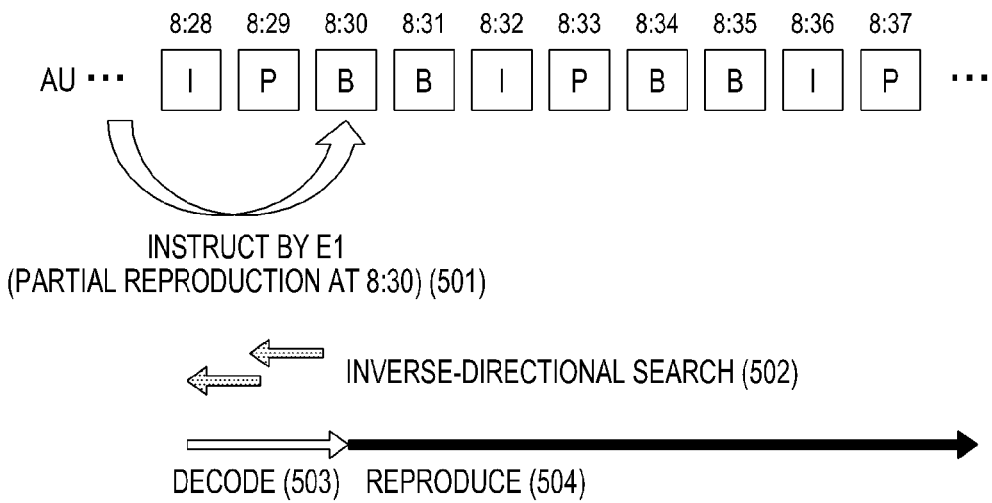
FIG. 5 illustrates a conventional process of receiving and reproducing a Data Unit (DU)
Figure 6:
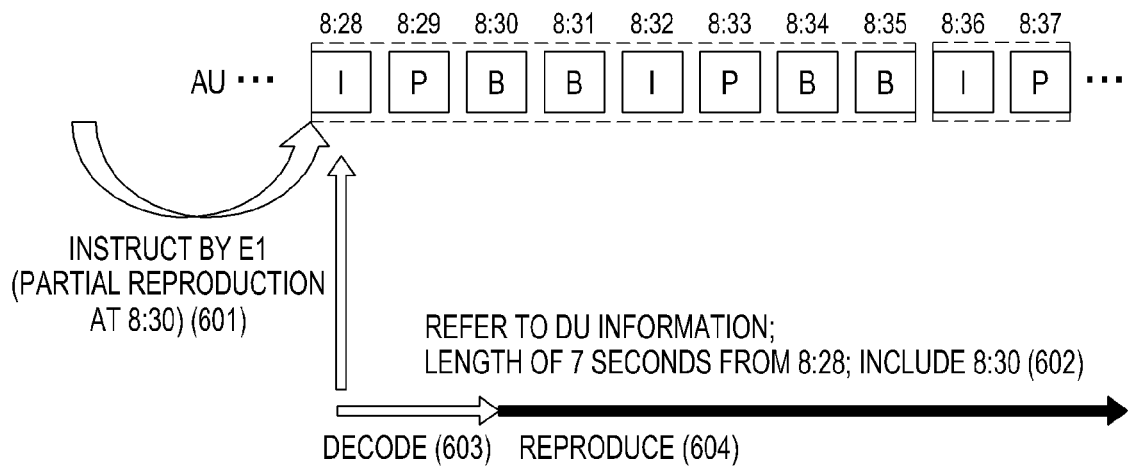
FIG. 6 illustrates a process of receiving and reproducing a DU according to an embodiment of the present invention.

FIGS. 4 and 5 illustrate a reproduction flow of a conventional DU configured by encapsulating the Aus, one by one, and FIG. 6 illustrates a reproduction flow of a DU configured with a plurality of AUs according to an embodiment of the present invention.

Referring to FIG. 4, when data begins to be received from a center of a DU string (401), because there is a probability that a corresponding DU is not the RAP, i.e., the I-picture, a receiver searches for the RAP, i.e., a DU in a type of I-picture, by continuously examining subsequent concatenated DUs (402), such that it is possible to initiate the reproduction the DU (403).

In accordance with an embodiment of the present invention, a DU is provided by grouping a plurality of AUs, and further configuring the DU in units of Group Of Pictures (GOPs), compared to the generation of a DU for each of the respective AUs. When the DU is configured in the GOPs, all DUs may be independently reproduced, without having to wait until a next DU is decoded, eliminating a complex buffer control requirement.

Further, as illustrated in FIG. 5, when Layer E1 (501) instructs reproduction while limiting a part of an ES, if the DU merely includes one AU, there is no guarantee that the DU corresponding to the instructed CTS is the I-picture. Therefore, it is necessary for the receiver to search for DUs prior to the corresponding DU in an inverse direction (502), decode the DUs from the I-picture (503), and reproduce the DU (504), in order to reproduce the DU from an instructed time point.

However, in accordance with an embodiment of the present invention, as illustrated in FIG. 6, when the DU is configured in a unit of a GOP (as indicated by a dashed line), the reproduction of the DU from a time (601) instructed in Layer E1 does not require an inverse-directional search of the DUs (602 through 604).

In accordance with an embodiment of the present invention, a DU may be configured with a plurality of GOP units. When the DU is configured with a plurality of GOP units, the I-pictures, the P-pictures, and the B-pictures are separately grouped and stored, and the respective data may be differently stored in three places.

Figure 7A:
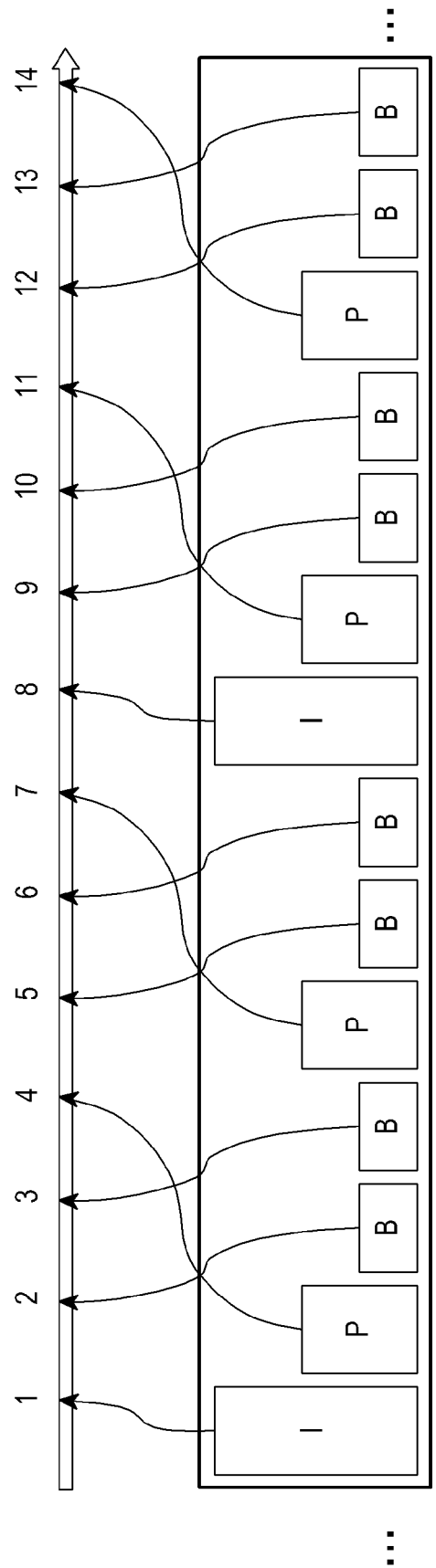
FIG. 7A illustrates a construction of conventional AUs.
Figure 7B:
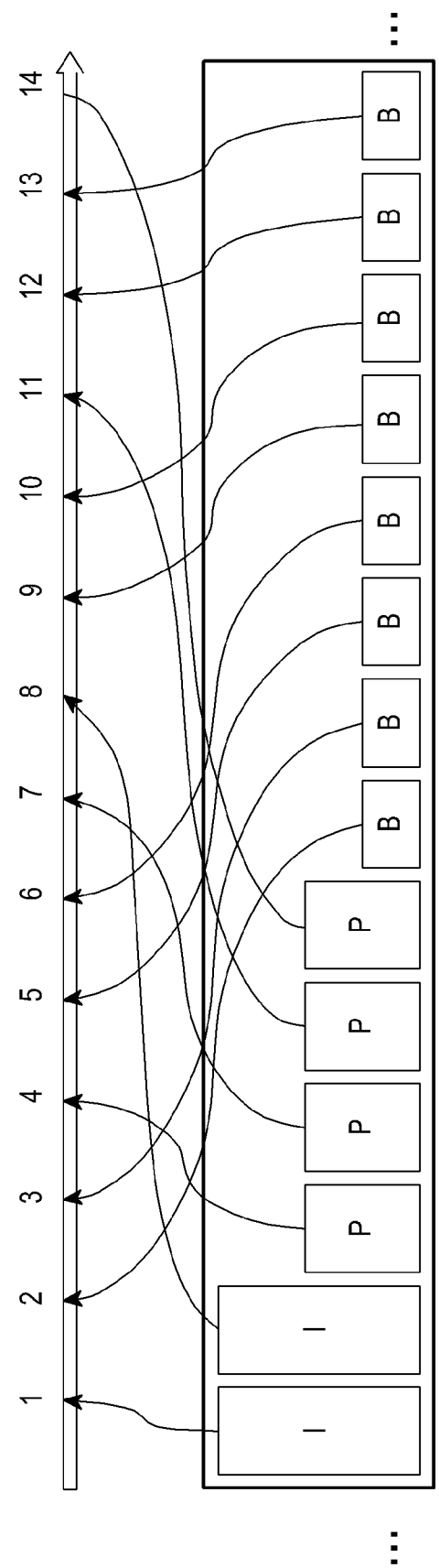
FIG. 7B illustrates a construction of AUs according to an embodiment of the present invention.

FIG. 7A illustrates a construction of a conventional AU, and FIG. 7B illustrates a construction of an AU according to an embodiment of the present invention.

As illustrated in FIG. 7B, when the AUs are grouped according to a property and stored in the DU, even if a part of the DU fails to be transmitted during the transmission, it is possible to realize temporal scalability through a frame drop, etc. Further, because a transmission system utilizing an error correction method, such as an AL-FEC, may utilize a recoverable scope by departmentalizing a scope recoverable with the AL-FEC into a part including the collected I-pictures, a part including the collected P/B-pictures, etc., grouping the AUs according to a property and stored them in the DU is also helpful for reducing transmission overhead due to the AL-FEC.

Figure 8A:
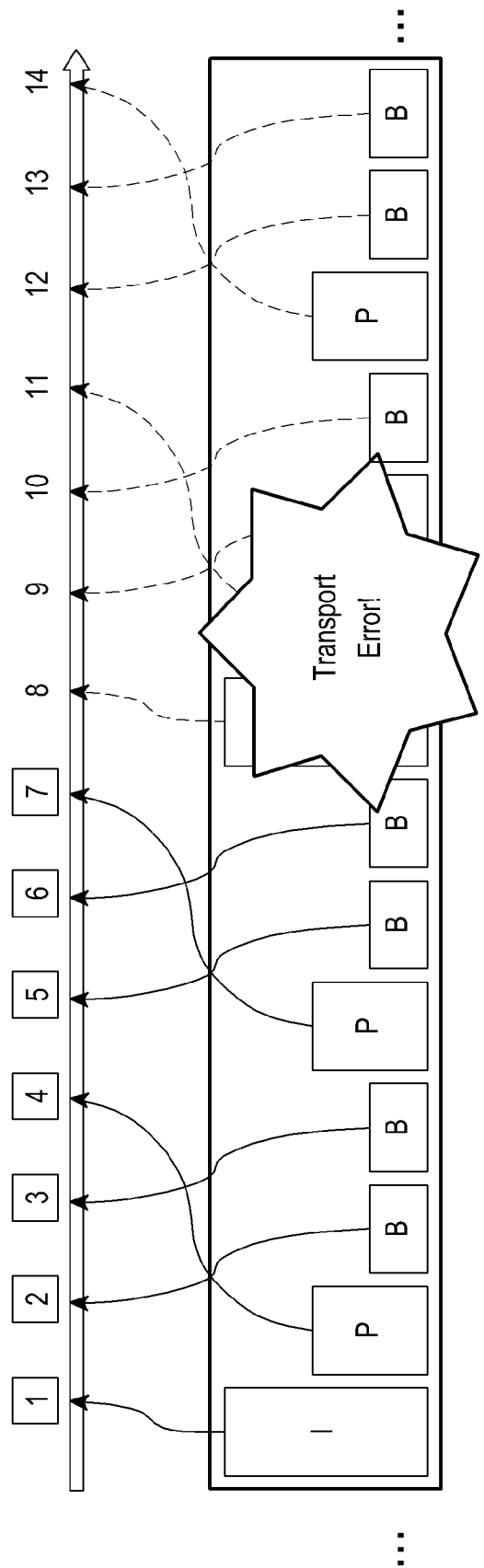
FIGS. 8A and 8B are diagrams illustrating a comparison of a temporal scalability according to a construction of AUs within a DU.
Figure 8B:
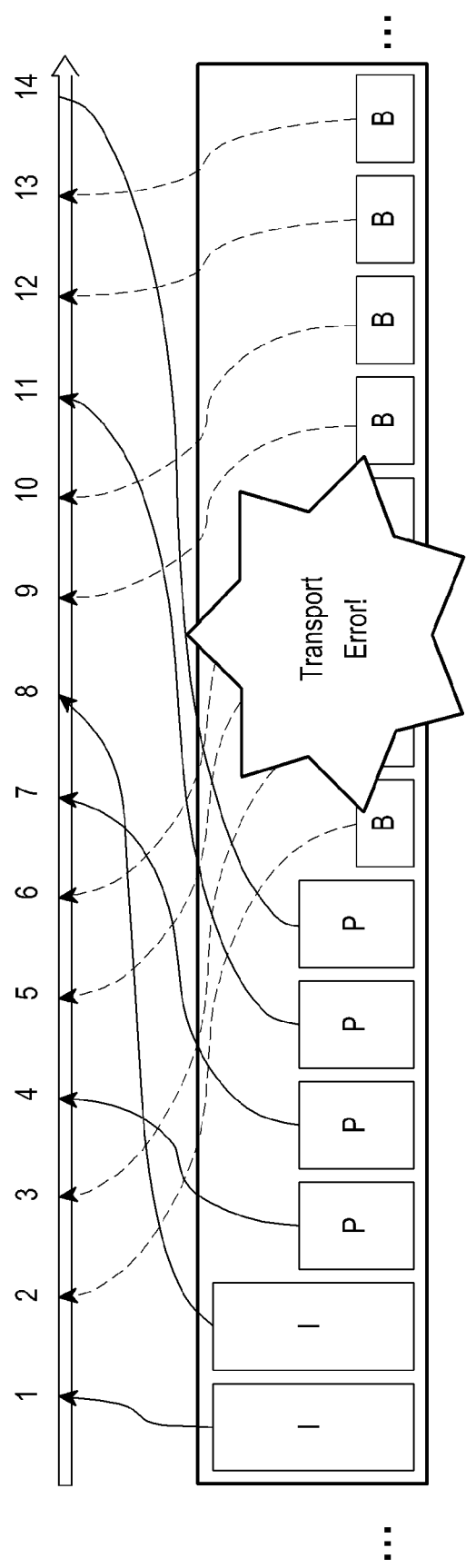

FIGS. 8A and 8B are diagrams illustrating a comparison of a temporal scalability according to a construction of AUs within a DU between a conventional art and an embodiment of the present invention.

Referring to FIGS. 8A and 8B, when the transmission of the DU is interrupted or an error is generated during the transmission of the DU, in FIG. 8A, it is impossible to view content after 8 seconds. However, in FIG. 8B, it is possible to view content for up to 14 seconds although it has a low temporal scalability.

Figure 9A:
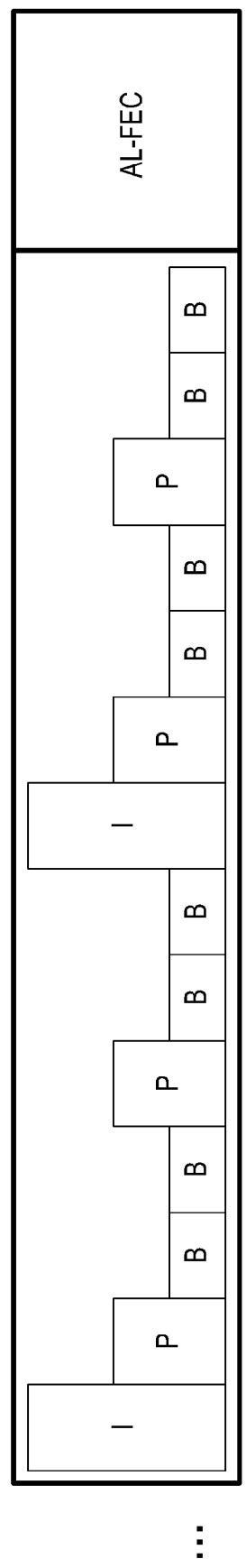
FIGS. 9A and 9B are diagrams illustrating a comparison of an Application-Forward Error Control (AL-FEC) according to a construction of AUs within a DU.
Figure 9B:
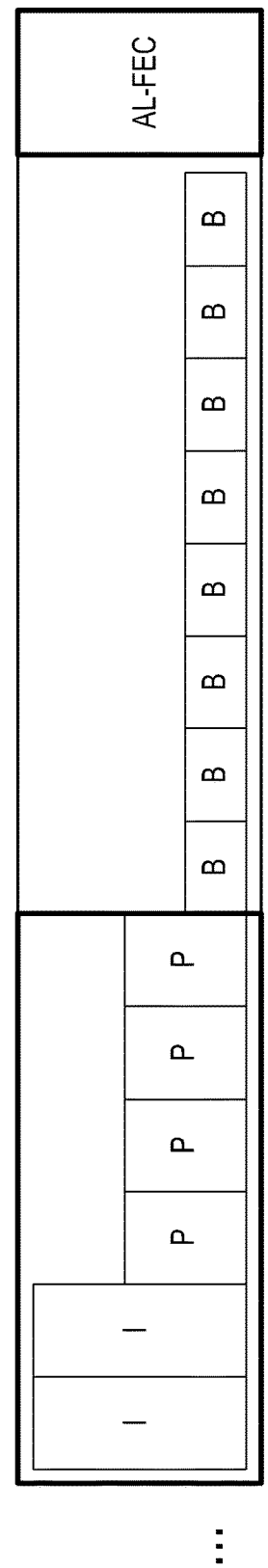

FIGS. 9A and 9B are diagrams illustrating a comparison of an AL-FEC according to a construction of AUs within a DU between the conventional art and an embodiment of the present invention.

As illustrated in FIG. 9A, when the I-pictures, the P-pictures, and the B-pictures are arranged without any consideration to picture type, it is impossible to identify the construction of the AUs within the DU. Consequently, AL-FEC must then be applied to all durations.

However, in accordance with an embodiment of the present invention, when the AUs are arranged according to picture type, because the AUs of the I-picture and P-picture affect a picture quality, it is sufficient to apply AL-FEC only to the AUs in the I-picture and P-picture, as indicated by a thick line of FIG. 9B. Accordingly, the overhead of the AL-FEC is decreased over the remaining durations, i.e., AUs of the B-pictures.

As described above, there are several advantages in the configuration of the DU within a unit of a GOP or a plurality of units of GOPs.

Figure 10:
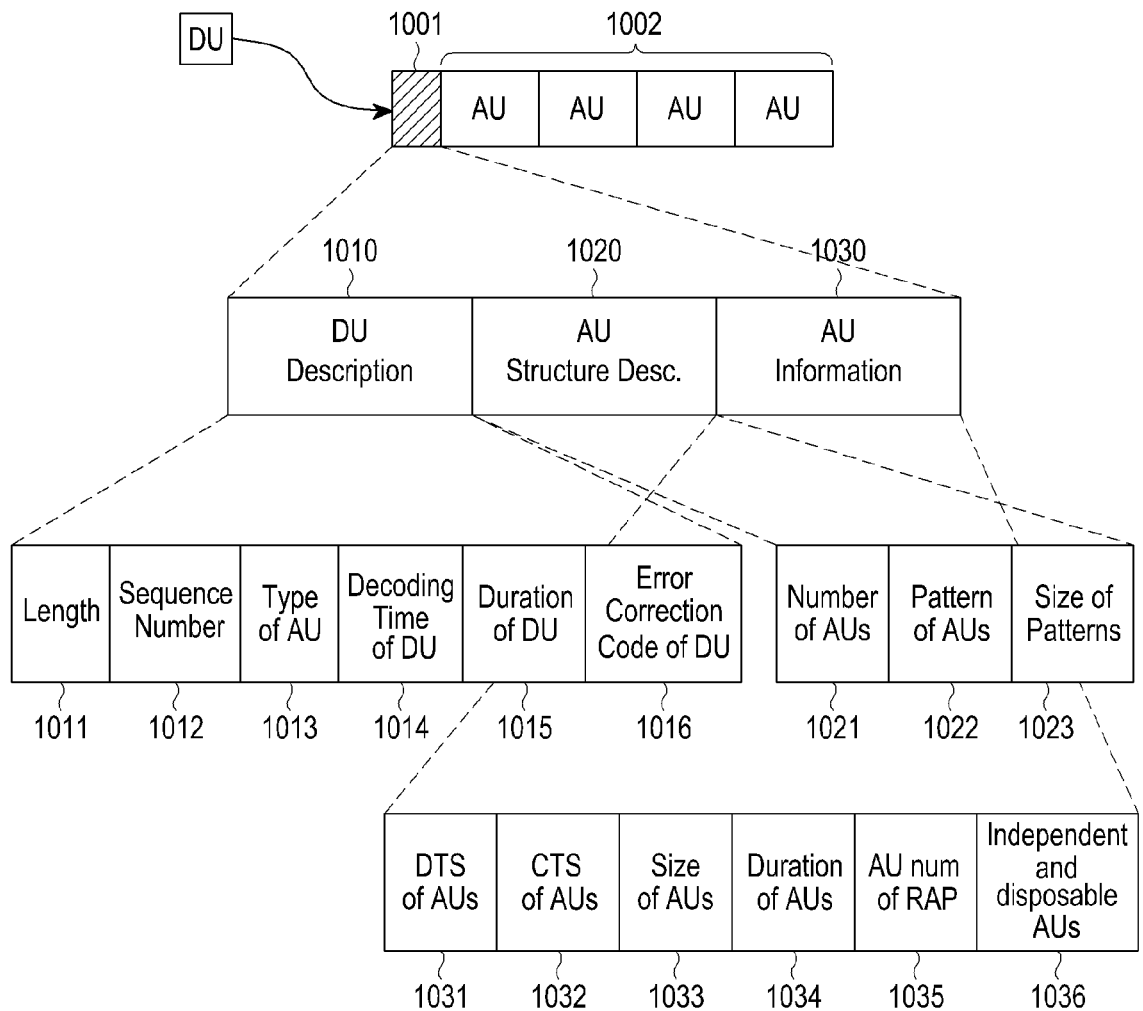
FIG. 10 illustrates a construction of a DU according to an embodiment of the present invention.

FIG. 10 illustrates a construction of a DU according to an embodiment of the present invention.

Referring to FIG. 10, the DU includes a header 1001 and a set of AUs 1002 included in a GOP or a plurality of GOPs.

The header 1001 includes a DU description 1010, which includes information on the DU, an AU structure description 1020, which includes information on a construction the AUs 1002, and AU information 1030, which includes information on each AU.

For example, the DU description 1010 may include the following information.

1) Length 1011: This information represents a size of a DU and is a value obtained by adding a size of headers of remaining DUs and a size of a payload after a corresponding field. For example, the Length 1011 may be represented in units of bytes.

2) Sequence Number 1012: This information represents a sequence of a corresponding DU within the ES. Omission or duplicate reception between a plurality of continuous DUs may be identified using the sequence number 1012. When an increase of sequence numbers between a previous DU and a continuously received DU exceeds "1", this indicates that an error is generated in the transmission of the DU.

3) Type of AU 1013: This information represents a type of AU included in the DU. For example, the AU may be generally classified into "timed data" or "non-timed data", expressed with "0" or "1", respectively. Timed data, represented by "0", includes the CTS and/or the DTS and corresponds to multimedia elements, such as video data and audio data. Non-time data, represented by "1", includes no CTS or DTS. The non-time data corresponds to general data, such a picture or a file.

4) Decoding Time of DU 1014: This information represents a time to start decoding a first AU of the DU, as a representative value.

5) Duration of DU 1015: This information represents a temporal length of the DU. A value obtained by adding a duration to the CTS of the first AU of the DU is the same as the time of termination of the reproduction of the finally decoded AU of the DU.

6) Error Correction Code of DU 1016: For example, a Cyclic Redundancy Check (CRC), a parity bit, etc., may be used as a code for error correction.

Further, an AU structure description 1020 may include the following information.

1) Number of AUs 1021: This information represents the number of AUs within the DU.

2) Pattern of AUs 1022: This information represents a structure and an arrangement pattern of AUs. For example, the Pattern of AUs 1022 may be indicated with values 0: open GOP, 1: closed GOP, 2: IPBIPB, 4: IIPPBB, 6: Unknown, or 8: reserved.

Each bit value is added through the OR calculation for use. For example, the construction of IPBIPB of the closed GOP is 1|2=3.

Open GOP, represented by "0", represents when the GOP is the open GOP. Closed GOP, represented by "1", represents when the GOP is the closed GOP. Definitions of the open GOP and closed GOP are the same as that of the conventional art.

IPBIPB, represented by "2", represents when I-pictures, P-pictures, and B-pictures are collected based on each group and repeated at least two times within the DU, e.g., IPBBIPBB or IPPBBBBIPPBBBB. IIPPBB, represented by "4", represents when I-pictures, P-pictures, and B-pictures are collected based on each group and repeated only one time within the DU, e.g., IIPPBBBB or IIPPPPBBBBBBBB.

Unknown, represented by "6", represents a failure to identify a pattern, and is used in when an order of AUs is not changed.

Reserved, represented by "8", represents a value reserved for a later user.

3) Size of Patterns 1023: This information represents a size of each duration of a repeated pattern. For example, when pattern IPBIPB is actually configured as IPPBBBBI-PPBBBB, lengths of duration I, duration PP, and duration BBBB are added to be represented as three values in units of bytes.

The size of the pattern may be expressed as:

for(i=0; i<number_of_patterns; i++){Size of patterns}:

Further, the AU information 1030 may include the following information.

1) DTS of AUs 1031: This information represents the DTS of the AU, and may be expressed as "for(i=0; i<number_of_AUs; i++){Decoding timestamp of AU;}".

2) CTS of AUs 1032: This information represents the CTS of the AU, and may be expressed as "for(i=0; i<number_of_AUs; i++){Composition timestamp of AU;}".

3) Size of AUs 1033: This information represents a size of the AU in the unit of bytes, and may be expressed as "for(i=0; i<number_of_AUs; i++){Size of AU;}".

4) Duration of AUs 1034: This information represents a temporal length of the AU, and may be expressed as "for(i=0; i<number_of_AUs; i++){Duration of AU;}".

5) AU num of RAP 1035: This information represents a number of the AU, and may be expressed as "for(i=0; i<number_of_RAPs; i++){AU number;}".

6) Independent and disposable AUs 1036: This information represents a relationship between a corresponding AU and a different AU, and may be expressed as "for(i=0; i<number_of_AUs; i++){Independent and disposable value of AU;}".

More specifically, when the corresponding AU is dependent on the different AU, a value of the Independent and Disposable AUs 1036 is "1", when the different AU refers to the corresponding AU, a value of the Independent and Disposable AUs 1036 is "2", and when the corresponding AU and the different AU have duplicated information, a value of the Independent and Disposable AUs 1036 is "4".

While the present invention has been shown and described with reference to certain embodiments and drawings thereof, it will be understood by those skilled in the art that various changes in form and details may be made therein without departing from the spirit and scope of the invention as defined by the appended claims.

What is claimed is:

1. A method of transmitting media data, the method comprising:
    processing a media processing unit (MPU) including a data part and a control part, the MPU being processed independently, wherein the data part includes media data and the control part includes parameters related to the media data; and
    transmitting, by a transmitter, the MPU,
    wherein the MPU includes at least one fragmentation unit,
    wherein the parameters include a first parameter and a second parameter, based on the first parameter having a first value, the first parameter indicates that the at least one fragmentation unit comprises timed data including timeline information for decoding and/or presentation of content of the timed data, and based on the first parameter having a second value, the first parameter indicates that the at least one fragmentation unit comprises non-timed data, which does not include the timeline information for decoding and/or presentation of the content of the non-timed data,
    wherein the second parameter indicates a sequence number of the MPU,
    wherein the MPU is transmitted in at least one packet and the at least one packet includes information indicating if the at least one packet includes at least one random access point (RAP), and
    wherein the at least one fragmentation unit in the MPU is grouped into a first group including one or more fragmentation units of an I-picture type and one or more fragmentation units of a P-picture type and a second group including one or more fragmentation units of a B-picture type, according to a picture type for each of the fragmentation units, the first group is disposed ahead of the second group, and application-forward error control (AL-FEC) is applied only to the first group.

2. The method as claimed in claim 1, wherein the data part includes the media data corresponding to at least one data group.

3. The method as claimed in claim 2, wherein the data group is a group of pictures.

4. The method as claimed in claim 1, wherein the parameters include information of a decoding order of each unit of the at least one fragmentation unit.

5. The method as claimed in claim 1, wherein the at least one packet includes position information of the RAP.

6. The method as claimed in claim 1, wherein, based on the at least one fragmentation unit comprising the timed data, the parameters include information on at least one of a presentation duration of each of the at least one fragmentation unit and a presentation order of each of the at least one fragmentation unit.

7. The method as claimed in claim 1, wherein the MPU is generated by a unit of a group of pictures (GOP) having a predetermined size.

8. The method as claimed in claim 7, wherein each of a plurality of different types of media data in the GOP is stored separately on the basis of a type of the media data.

* * * * *